United States Patent [19]
Yoshida et al.

[11] 4,005,450
[45] Jan. 25, 1977

[54] INSULATED GATE FIELD EFFECT TRANSISTOR HAVING DRAIN REGION CONTAINING LOW IMPURITY CONCENTRATION LAYER

[75] Inventors: Isao Yoshida, Nishitama; Takeshi Tokuyama, Higashikurume; Shigeru Nishimatsu, Kokubunji; Takahide Ikeda, Kodaira, all of Japan

[73] Assignee: Hitachi, Ltd., Japan

[22] Filed: Dec. 16, 1974

[21] Appl. No.: 532,923

Related U.S. Application Data

[60] Continuation-in-part of Ser. No. 391,047, Aug. 24, 1973, abandoned, which is a division of Ser. No. 142,933, May 13, 1971, Pat. No. 3,787,962.

[30] Foreign Application Priority Data

May 13, 1970  Japan .............................. 45-40114

[52] U.S. Cl. .................................. 357/23; 357/52; 357/54
[51] Int. Cl.² ........................................ H01L 29/78
[58] Field of Search ................. 357/23, 54, 41, 53, 357/52

[56] References Cited
UNITED STATES PATENTS

| | | |
|---|---|---|
| 3,596,347 | 8/1971 | Beale et al. .......................... 357/23 |
| 3,631,312 | 12/1971 | Moyle et al. ......................... 357/23 |
| 3,760,242 | 9/1973 | Duffy et al. .......................... 357/54 |

Primary Examiner—Michael J. Lynch
Assistant Examiner—Joseph E. Clawson, Jr.
Attorney, Agent, or Firm—Craig & Antonelli

[57] ABSTRACT

An insulated gate field effect transistor formed on one main surface of a semiconductor substrate comprises a drain region the impurity concentration of which is lower than twice that of the semiconductor substrate and the conductivity type is reverse to that of the substrate and a region of a high impurity concentration, formed in the low impurity concentration region, the conductivity type of which is the same as that of the low impurity concentration region.

13 Claims, 17 Drawing Figures

INSULATED GATE FIELD EFFECT TRANSISTOR HAVING DRAIN REGION CONTAINING LOW IMPURITY CONCENTRATION LAYER

CROSS-REFERENCES TO RELATED APPLICATIONS

This is a continuation-in-part application of Ser. No. 391,047, now abandoned which is a divisional application of Ser. No. 142,933 filed on May 13, 1971, now U.S. Pat. 3,787,962.

BACKGROUND OF THE INVENTION

1. Field of the Invention

This invention relates to insulated gate field effect transistors and methods of producing the same and, more particularly, to insulated gate field effect transistors in which a low impurity concentration layer is disposed in the drain region, whereby the feedback capacitance between the gate and drain is lowered and the transconductance is increased, and thus improved high frequency characteristics are obtained.

2. Description of the Prior Art

To improve the high frequency characteristic of metal insulator semiconductor field effect transistor (hereinafter briefly referred to as MIS-FET) in the prior art, it has been known to be effective if the channel length of the gate region (channel region) located between the source and drain regions is made as short as possible and the capacitance between the gate and drain (or source) is reduced.

To realize this idea, a method of producing MIS-FET for high frequency applications was proposed in U.S. Pat. No. 3,472,212 and in U.S. Pat. No. 3,596,347. According to this method, a gate electrode is disposed on one surface of a semiconductor substrate by way of an insulation layer, and source and drain regions are formed on the substrate by ion implantation using the gate electrode as a mask. In this MIS-FET, the channel length depends on the gate electrode width. In other words, the channel length can be reduced to the extent where photo-etching is applicable for the formation of the gate electrode. The source and drain regions can be formed without increasing the capacitance between the gate and drain for source, contrary to the method of forming the source and drain regions by impurity diffusion, wherein the source and drain regions are extended to the region beneath the gate electrode and the gate electrode is superposed on the source or drain region to increase the capacitance therebetween. In the MIS-FET with a reduced channel length, however, there exists the tendency of the punch-through phenomenon between the source and drain, due to expansion of the depletion layer in the channel region with an increase in the bias across the drain and source. Furthermore, the transconductance is varied widely by a change in the bias voltage.

To solve the problem of punch-through, some improved MIS-FETs in which a region of low impurity concentration is disposed in the drain region have been proposed heretofore. One of these MIS-FETs utilizes a double diffusion technique wherein an impurity for forming the gate region and an impurity for forming the source region are thermally diffused in succession into a semiconductor substrate (to become the drain region) of low impurity concentration, whereby the source, gate and drain regions are formed along the vertical direction from the surface to the base of the substrate. Another MIS-FET is such that the gate region whose conductivity type is reverse or opposite to that of the substrate is formed on the surface of a semiconductor substrate of low impurity concentration by an impurity diffusion process, and a layer of high impurity concentration whose conductivity type is the same as that of the substrate is disposed on both sides of the gate region on the surface of the substrate, whereby the drain and source regions are formed.

In the former MIS-FET, the channel length (the gate region width) can be reduced because the MIS-FET is formed by double diffusion. However, it is difficult to provide a gate electrode lead; rarely, part of the surface of the substrate is etched down to the gate diffusion layer to expose the gate region, the hollow part formed by the etching is covered with a thin insulation film and the hollow is filled with a sufficiently thick gate electrode metal layer. In such structure, it is inevitable that the source region and gate electrode are superposed on each other and, as a result, the source gate capacitance is increased.

In the latter MIS-FET, a narrow gate region (short channel length) can hardly be realized because the gate region is formed by impurity diffusion. Furthermore, the electrical isolation between the source and drain is reduced because the source and drain regions are linked with each other by way of the low impurity concentration substrate whose conductivity type is the same as those of the source and drain regions.

To obtain a low output capacitance and a relatively close spacing of source and drain regions, a further MIS-FET has been proposed in British Pat. No. 1,153,428. This MIS-FET has the drain region comprising two semiconductor regions, one of which is surrounded by the other having a lower impurity concentration than that of said one region. However, in this MIS-FET, a gate electrode extends over p-n junctions between the respective source and drain regions, and hence a gate-source feedback capacitance becomes large. For this large capacitance, at high operating frequencies, the impedance of capacitive coupling will be so low as to be a substantial short circuit, so that when an input signal is applied, substantially no useful output signal is obtained.

Figure 5:
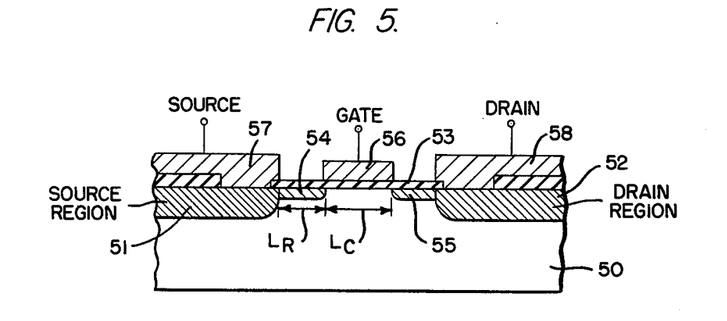
FIG. 5 is a longitudinal sectional view of one MIS-FET considered by the inventors from the prior art.

Referring first to FIG. 5, there is shown a structure of one MIS-FET considered from MIS-FETs described in U.S. Pat. No. 3,596,347 and British Pat. 1,153,428.

This MIS-FET comprises as n-type silicon substrate 50, a p-type semiconductor region 51 which acts as a main source, disposed in the substrate 50, a p-type semiconductor region 52 which acts as a main drain, disposed in another portion of the substrate 50, an insulating layer 53 disposed on the surface of the substrate 50 between the source and drain regions 51 and 52, a p-type semiconductor region 54 having a lower impurity concentration than that of the main source region 51, which acts as a sub-source, disposed in the substrate 50 so that one end thereof contacts to the main source region 51, a p-type semiconductor region 55 having a lower impurity concentration than that of the main drain region 52, which acts as a sub-drain, disposed in the substrate 50 so that one end thereof contacts to the main drain region 52, a gate electrode 56 disposed on the insulating layer 53 at a portion corresponding to a portion of the substrate 50 between the sub-source and drain regions, and source and drain electrodes 57 and 58 contacted to the main source and main drain regions, respectively.

With this type of structure, a resistance $R_S$ between the source region and the gate electrode becomes large. When the resistance $R_S$ becomes large, the transconductance $gm_{eff}$ decreases, as illustrated below, as compared with a device which does not have a resistance $R_s$. Namely, $gm_{eff} = gm/(1 + gmR_s)$.

Generally, since the drain current $I_D$ and the cut-off frequency $f_c$ of the device are established as follows:

$$I_D = \tfrac{1}{2} g_m (V_G - V_T),$$

and $$f_c = g_m/2\pi C,$$

where $V_T$ is the threshold voltage of the device,
$V_G$ is the gate voltage, and
$C$ is the capacitance, when the trans-conductance is decreased, the drain current $I_D$ and the cut-off frequency of the device decrease, so that a high output gain and a high frequency response cannot be obtained.

For purposes of further illustration, a concrete determination of the trans-conductance $gm_{eff}$ of the device will be calculated below.

The sheet resistivity $\rho_S$ of the n-region is about $10^{20} K\Omega/\square$ for the device having a high breakdown voltage characteristic and a low capacitance characteristic. As a result, the resistance $R_S$ of the low impurity concentration region 1 is determined as follows:

$$R_s = \rho_S (W_R/L_R),$$

wherein $L_R$ and $W_R$ are the length and the width of the low impurity concentration region 1, respectively.

Now, for the transconductance $g_m$ being established by $$g_m = (10 \text{ to } 20) \times 10^{-6} \times (V_G - V_T) (W_C/L_C)$$

wherein $L_C$ and $W_C$ are the length and width of the channel respectively, and the widths $W_R$ and $W_C$ are equal to each other, then, when the lengths $L_R$ and $L_C$ are nearly equal to each other, and $(V_G - V_T)$ is equal to 10V, the product $R_S \cdot g_m = 1$ to 4 and hence, the effective transconductance $gm_{eff}$ decreases to a value of 50 to 20% of $g_m$.

Since the drain current and the cut-off frequency of the device are proportional to its transconductance, for a low impurity concentration region being disposed between the source and gate electrode, the characteristics of the device deteriorate.

The present invention eliminates above-mentioned defects, in other words, the present invention provides superior electronic characteristics.

A general object of this invention is to provide a MIS-FET in which the channel length is short and the drain region comprises a region whose impurity concentration is low, and to provide a method of producing such MIS-FET.

Briefly, in connection with a semiconductor device which comprises a semiconductor substrate, a source region, a drain region and a gate region, wherein the source and drain regions whose conductivity types are reverse or opposite to that of the substrate, are formed on the surface of the substrate by way of the gate region whose conductivity type is the same as that of the substrate, the MIS-FET of this invention is characterized in that the drain region comprises a region having a low impurity concentration, and a region having a high concentration of impurity with the same conductivity type as that of the substrate is disposed in the low impurity concentration region. The method of producing such a MIS-FET according to this invention is characterized in that an insulated gate electrode is disposed on the surface of the semiconductor substrate, this electrode is used as a mask to implant thereinto ions of an impurity whose conductivity type is reverse to that of the substrate, thereby forming a low impurity concentration region in the area corresponding to at least the drain region on the surface of the substrate and also forming a high impurity concentration region whose conductivity type is reverse to that of the substrate in the area corresponding to the low impurity concentration region and the source region.

According to this invention, the purpose of disposing a low impurity concentration region in the drain region is to keep the depletion layer from being extended into the gate region and to prevent the formation of large gate drain feedback capacitance even if the gate electrode is superposed on the low impurity concentration region.

In the prior art, there exist difficulties in forming a low concentration diffusion layer on the surface of a semiconductor substrate. In contrast thereto, the invention provides a solution to this problem. Namely, a low concentration impurity diffusion layer is formed on the drain region by utilizing ion implantation techniques. In the method of forming an ion implantation region in a semiconductor substrate, the depth and concentration of the implantation region can be accurately controlled by suitably determining the ion energy, the ion current density, the implanting time, etc.

The concept of "low impurity concentration" used according to this invention denotes a low impurity concentration relative to the concentration of an impurity added thereto by the usual impurity thermal diffusion technique.

Furthermore, since usually the impurity concentration of the substrate of a MIS-FET is not too high (for example, $5.0 \times 10^{15}$ /cm$^3$), the gate drain feedback capacitance is not appreciably large. This helps realize an operably ideal circuit design.

The invention will be better understood from the following detailed description taken in conjunction with the accompanying drawings.

DETAILED DESCRIPTION

Figure 1A:
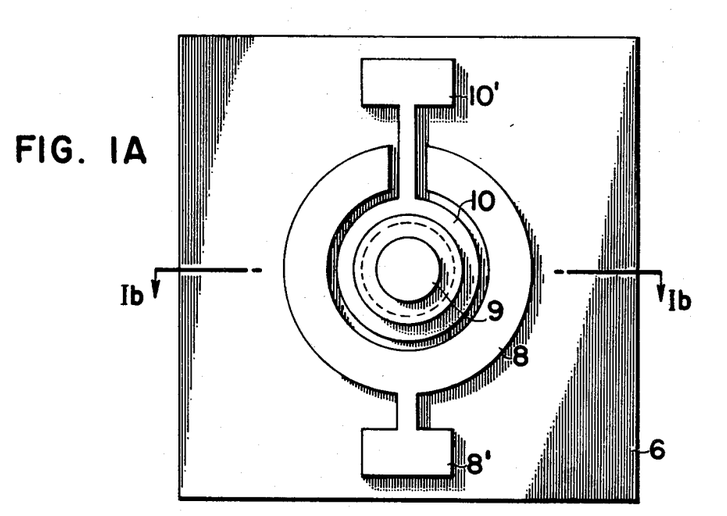
FIG. 1A is a front view and FIG. 1B is a longitudinal sectional view illustrating a MIS-FET embodying this invention.
Figure 1B:
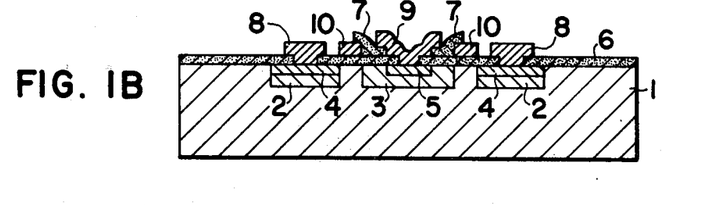

Referring now to FIGS. 1A and 1B, there are shown the essential structure of a MIS-FET embodying this invention; whereby FIG. 1A is a front view, and FIG. 1B is a longitudinal sectional view taken along line 1b–1b of FIG. 1A.

In FIGS. 1A and 1B, the reference numeral 1 denotes a substrate such as, for example, an N type silicon substrate, and reference numerals 2 and 3 P⁻ type low impurity concentration regions formed in the substrate within the area of the source and drain regions, respectively. According to this invention, the region 2 is not always required. Reference numerals 4 and 5 denote P⁺ type high impurity concentration regions formed in the low impurity concentration regions 2 and 3. The P⁺ type high impurity concentration region 4 formed in the source region is nearly fully superposed on the low impurity concentration layer 2, while, the P⁺ type high impurity concentration region 5 formed in the drain region is formed within the P⁻type low impurity concentration region 3. Reference numeral 6 represents an insulation film, for example, an $SiO_2$ film, disposed on the surface of the substrate 1. This insulation film 6 is used as the gate insulation film located immediately beneath the gate electrode and also as the surface protection film of the MIS-FET. Reference numeral 7 denotes an insulation layer, for example, an $SiO_2$ film layer, disposed in the production process of the MIS-FET. This layer 7 is not very essential for the purposes of this invention. The purpose of this layer 7 is to prevent an electrical short between the gate and drain electrodes. The reference numerals 8, 9 and 10 denote source, drain and gate electrodes, respectively. Any material which can establish good ohmic contact with the silicon substrate may be used for these electrodes. Usually, such metals as aluminum, molybdenum, chromium, nickel and tungsten are used for the electrodes. Instead, a semiconductor layer of silicon or the like may be formed for use as the electrodes. In this embodiment, a molybdenum evaporation layer is used.

In FIG. 1A, reference numerals 8' and 10' indicate electrode bonding areas for external leads from the source and gate electrodes.

Figure 2:
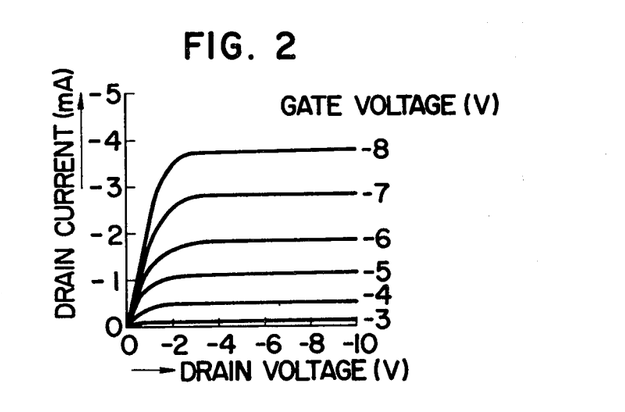
FIG. 2 is a diagram showing the electrical characteristics of a transistor of this invention.

A concrete example of this MIS-FET will be given below. Phosphorus is used as the impurity for the silicon substrate at an impurity concentration $N_D$ of about $5 \times 10^{15}/cm^3$. Boron is used as the impurity for the P⁻ type low impurity concentration regions 2 and 3 at an impurity concentration $N_A$ of about $1 \times 10^{15}/cm^3$. Similarly, boron is used as the impurity for the P⁺ type high impurity concentration regions 4 and 5 at an impurity concentration of about $5 \times 10^{19}/cm^3$. The regions 2 and 3 are formed to a thickness of about $3\mu$, the regions 4 and 5 to a thickness of about 1, the gate region to a width of $2\mu$, the P⁻ type low impurity concentration region located between the gate region and the P⁺ type high impurity concentration drain region 5 to a width of about $5\mu$, the $SiO_2$ films 6 and 7 to a thickness of about $0.2\mu$, and the molybdenum electrode layer to a thickness of about $0.5\mu$. This MIS-FET shows the electrical characteristics as indicated in FIG. 2.

Figure 3:
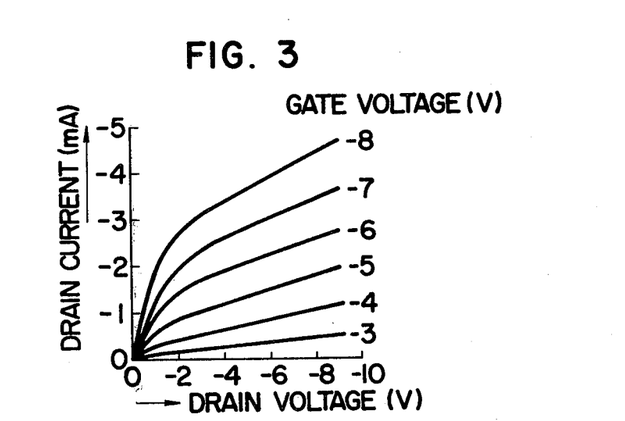
FIG. 3 is a diagram showing the electrical characteristics of a conventional insulated gate field effect transistor.

For comparison purposes, FIG. 3 shows the electrical characteristics of a conventional MIS-FET. From FIG. 3, it is apparent that the conventional MIS-FET is accompanied by a punch-through phenomenon, whereas, as indicated by the electrical characteristics in FIG. 2, the MIS-FET formed in the foregoing manner according to this invention gives rise to no punch-through phenomenon. The structure of the MIS-FET shown in FIG. 1 will be more apparent from the following description when read by referring to FIGS. 4A through 4H. Generally, several thousands of MIS-FETs are formed simultaneously in one semiconductor wafer. For explanatory simplicity, one MIS-FET element is considered in this embodiment, and FIG. 4 illustrates the essential parts thereof.

A $0.2\mu$ thick $SiO_2$ film 12 is formed by thermal oxidation on the surface of an N type silicon substrate 11 whose impurity concentration $N_D$ is $5 \times 10^{15}/cm^3$. An electrode metal such as Mo 13 is deposited on the $SiO_2$ film 12 to a thickness of $0.5\mu$. The Mo layer is selectively removed by an etching solution consisting chiefly of a mixture solution of $H_2SO_4$ and $HNO_3$ whereby grooves 14 and 15 are formed. This sample is placed in a conventional apparatus of ion implantation (not shown diagrammatically) and boron ions 16 are implanted into the sample at ion accelerating voltages of 400, 300, 200, 100 and 50 kV to the value of $10^{11}$ parts/cm², respectively. (Note: Twenty seconds of ion irradiation is required for implanting $10^{11}$ parts/cm² ions.) The reason why ions are implanted at different voltages (i.e., at different energies) is because the implanted impurity is distributed in the Gaussian form centering at a range R (the distance from the surface of substrate) determined by this energy. In other words, to obtain a uniform impurity concentration distribution, it is necessary to implant ions thereinto in steps of energy. By adding the impurities together which have been implanted in steps, a uniform impurity distribution can be obtained. Thus, in the foregoing manner, $3\mu$ thick P⁻ type low impurity source and drain regions 17 and 18 with an impurity concentration of $1 \times 10^{15}/cm^3$ are formed.

Figure 4A:
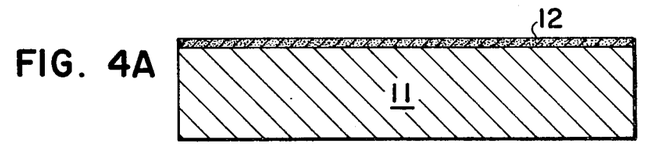
FIGS. 4A through 4H' illustrate by longitudinal sectional views the steps of the production of a MIS-FET according to this invention.
Figure 4B:
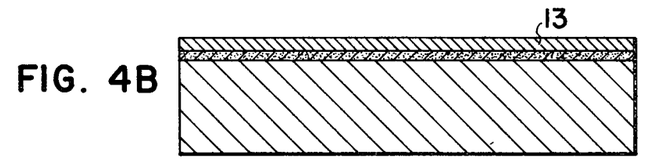
Figure 4C:
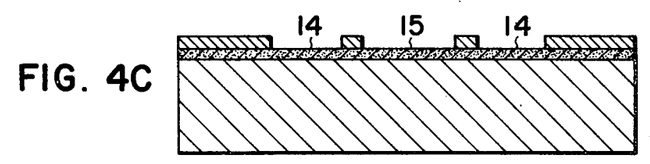
Figure 4D:
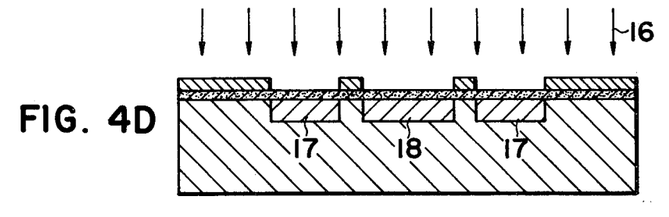
Figure 4E:
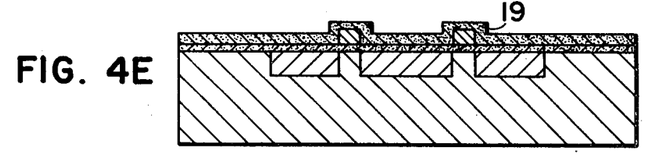
Figure 4F:
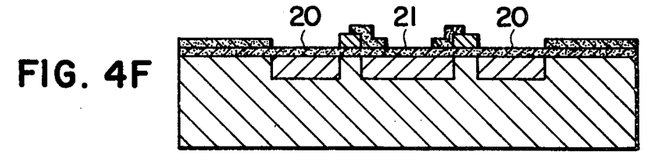

In the ion implanting process, if it is desirable that the substrate is kept heated at a temperature of 600° to 800° C during ion implantation or subjected to heat treatment at a temperature of 600° to 800° C after ion implantation. This consideration serves to improve the electrical characteristics of the PN junction formed in the substrate. Then the Mo layer excepting specific areas is removed by etching, and an about $0.2\mu$ thick $SiO_2$ film 19 is deposited on the surface of the substrate by thermal decomposition of organo-oxy-silane or mono-silane. In order to expose part or the entire $SiO_2$ layer 12 which covers the low impurity source and drain regions, grooves 20 and 21 are formed on the $SiO_2$ layer 12 by photo-etching technique.

Figure 4G:
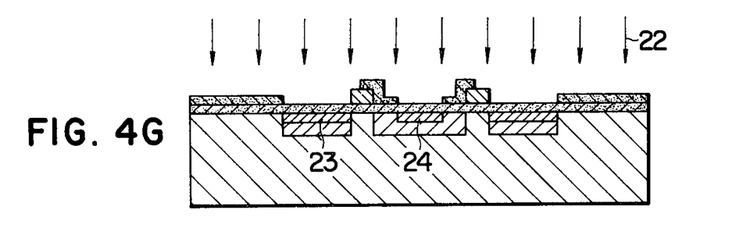

Then, the sample is placed in the ion implantation apparatus again, and boron ions 22 are irradiated onto the sample. In this process, the ions are accelerated at 100kV and irradiated for 2 minutes (implanted quantity: $10^{15}$ parts/cm²) and then at 50kV for 2 minutes (implanted quantity: $10^{15}$ parts/cm²). The ions do not pass through the region of the double $SiO_2$ film and the metal layer but through the thin $SiO_2$ layer, whereby P⁺ high impurity concentration source and drain regions 23 and 24 with an impurity concentration $N_A$ of $5 \times 10^{19}$ /cm³ are formed to a depth of $1\mu$. (FIG. 4G).

Figure 4H:
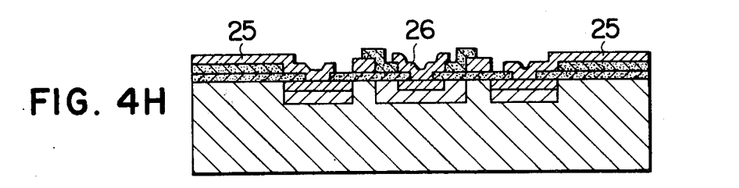

Part of the $SiO_2$ film 12 on the high impurity concentration regions 23 and 24 is removed to expose the electrode areas of the regions 23 and 24, and source and gate electrodes 25 and 26 are formed by evaporation of molybdenum. (FIG. 4H).

Thus, a MIS-FET as shown in FIG. 1 is formed.

The production steps (E), (F), (G) and (H) may be replaced with steps (E'), (F'), (G') and (H'). Ions are implanted into the surface of the substrate as shown in FIG. 4D, and then a metal layer 27 of aluminum, molybdenum, chromium, tantalum or the like is deposited on the surface of the substrate as shown in FIG. 4E'. Specific areas 28' and 29 are removed by photoetching in order to expose part or the whole of the $SiO_2$ film 12, located above the low impurity concentration region. (FIG. 4F').

Then, boron ions 30 are irradiated onto the sample in the same manner as in FIG. 4G whereby boron high impurity concentration regions 31 and 32 (i.e., source and drain regions) are formed.

After this process, part of the $SiO_2$ film on the high impurity concentration region is exposed, and source and drain electrode metals are deposited on the exposed area. The MIS-FET formed in the above manner is shown by a longitudinal sectional diagram in FIG. 4H' wherein reference numerals 33, 34 and 35 denote the source, drain and gate electrodes, respectively. The difference between the MIS-FET shown in FIG. 4H and that in FIG. 4H' is that the metal layer which serves as the gate electrode is extended into the region above the low impurity concentration drain region in the structure shown in FIG. 4H'.

The low impurity concentration drain region according to this invention is formed by ion implantation. In order to control the impurity concentration of this drain region to be less than twice that of the substrate, it is necessary that a reverse conductivity type impurity whose impurity concentration is in the range from 1 to 2 times the impurity concentration of the substrate is added to the substrate crystal.

To know the quantity of ions implanted into the surface of the semiconductor substrate, the current (micro-coulomb/$cm^2$) flowing in the substrate during ion implantation is measured. The number of implanted ions is given in terms of current.

The foregoing MIS-FET formed according to this invention has the following advantages:

1. Because of a low impurity concentration region disposed in the drain region, the extension of the depletion layer into the gate region is limited and, as a result, the channel length is reduced and thus a MIS-FET with desirable high frequency characteristics can be obtained.

2. It has been impossible by diffusion techniques to form a low impurity concentration region of reverse conductivity type whose impurity concentration is less than twice that of the substrate; whereas, according to this invention, the impurity concentration can easily be controlled by the use of ion implantation.

3. The source, drain and gate electrodes can be gathered on the surface of one semiconductor substrate. In the production of integrated circuit, all wiring can be disposed on the surface of one chip by metal evaporation. Thus, the production efficiency can be markedly increased.

4. The MIS-FET of this invention can be formed within a reduced time and at a low temperature. Practically, the time required for ion implantation is only several tens of minutes, and the heat applied to the semiconductor substrate is only 600° to 800° C during ion implantation or only 600° to 700° C after ion implantation, whereas the temperature and time required for impurity thermal diffusion are 1200° C and several hours, respectively. In other words, the invention is suitably applicable to mass production of MIS-FET and integrated circuit devices and is highly useful for various industrial purposes.

It is apparent that the invention is not limited to the foregoing examples but numerous modifications thereof may be made without departing from the true spirit of the invention.

For example, the known semiconductor such as Ge, GaAs, InP and InSb may be used instead of Si for the semiconductor substrate. In the foregoing embodiments, an $SiO_2$ film is used for the insulation film on the semiconductor substrate. Instead, an $Si_3N_4$ film, $Al_2O_3$ film, $SiO_2.P_2O_5$ (phosphosilicate glass) film, $SiO_2.PbO$ film, $SiO_2.PbO$ (leadsilicate glass) film, $SiO_2.B_2O_5$ (boronsilicate glass) film, a double film formed by combining two films such as $SiO_2$ and $SiO_2.P_2O_5$ films, $SiO_2$ and $Al_2O_3$ films, etc. may be used.

Also, a semiconductor material such as silicon may be used instead of metal for the gate electrode. When silicon is used for the gate electrode, the threshold voltage of the insulated gate field effect transistor can be controlled by suitably adding an impurity to the silicon layer.

While we have shown and described several embodiments in accordance with the present invention, it is understood that the same is not limited thereto but is susceptible of numerous changes and modifications as known to those skilled in the art and we therefore do not want to be limited to the details shown and described herein, but intend to cover all such changes and modifications as are within the scope of the appended claims.

We claim:
1. An insulated gate field effect transistor comprising:
a semiconductor substrate of a first conductivity type;
a source region of a second conductivity type, opposite said first conductivity type and having an impurity concentration higher than that of said substrate, disposed in a first surface portion of said substrate and defining with said substrate a first p-n junction which extends to the surface of said substrate;
a drain region disposed in a second surface portion of said substrate spaced apart from said source region by a third surface portion of said substrate therebetween, said drain region comprising
a first semiconductor region having a second conductivity type and forming a second p-n junction with said substrate which extends to the surface of said substrate, and
a second semiconductor region having said second conductivity type and an impurity concentration higher than the impurity concentration of said first region and the same as that of said source region, disposed in a surface portion of said first region and being separated from said third surface portion of said substrate by said first semiconductor region therebetween;
a first insulating film disposed on said substrate at least between said source and drain regions;
a gate electrode disposed on said first insulating film between said source and drain regions so that one edge of said gate electrode is aligned with the termination of said first p-n junction at the surface of said substrate, and the other edge of said gate electrode opposing to said one edge of said gate electrode is aligned with the termination of said second p-n junction at the surface of said substrate;
a second insulating film disposed on said second surface portion of said substrate at least between said third surface portion and said second semiconductor region; and electrodes connected to said source region and to said second semiconductor region, respectively.

2. An insulted gate field effect transistor in accordance with claim 1, wherein said semiconducotr substrate is a semiconductor selected from the group consisting of semiconductors Si, Ge, GaAs, InP and InSb.

3. An insulated gate field effect transistor in accordance with claim 1, wherein the first insulating film disposed on said semiconductor substrate is a film selected from the group consisting of $SiO_2$, $Si_3N_4$, $Al_2O_3$, $SiO_2.PbO$, $SiO_2.P_2O_5$, $SiO_2.B_2O_5$ films, and double layer films formed of a combination of two of these films.

4. An insulated gate field effect transistor according to claim 1, wherein the depth of said first region in said substrate is greater than the depth of said second region in said first region.

5. An insulated gate field effect transistor according to claim 1, further including a buried semiconductor region of said second conductivity type underlying and contiguous to said source region and forming an extension of said first p-n junction with said substrate beneath said source region.

6. An insulated gate field effect transistor according to claim 5, wherein said buried region has the same impurity concentration as said first semiconductor region.

7. An insulated gate field effect transistor in accordance with claim 4, further including a buried semiconductor region of said second conductivity type underlying and contiguous to said source region and forming an extension of said first p-n junction with said substrate beneath said source region.

8. An insulated gate field effect transistor according to claim 7, wherein said buried region has the same impurity concentration as said first semiconductor region.

9. An insulated gate field effect transistor in accordance with claim 1, wherein the gate electrode is made of a material selected from the group consisting of metals and semiconductor materials.

10. An insulated gate field effect transistor in accordance with claim 1, wherein the second insulating film is a film selected from the group consisting of $SiO_2$, $Si_3N_4$, $Al_2O_3$, $SiO_2P_2O_5$, $SiO_2PbO$, $SiO_2B_2O_5$, and double layer films formed of a combination of two of these films.

11. An insulated gate field effect transistor according to claim 1, wherein the impurity concentration of said first region is less than twice that of said semiconductor substrate.

12. An insulated gate field effect transistor comprising:
a semiconductor substrate of a first conductivity type;
a first semiconductor region which acts as a source region, having a second conductivity type, opposite said first conductivity type and having an impurity concentration higher than that of said substrate, disposed in a first surface portion of said substrate and defining with said substrate a first p-n junction which extends to the surface of said substrate;
a second semiconductor region having said second conductivity type and forming a second p-n junction with said substrate which extends to the surface of said substrate, disposed in a second surface portion of said substrate spaced apart from said first semiconductor region by a third surface portion of said substrate therebetween;
a third semiconductor region having said second conductivity type and an impurity concentration higher than the impurity concentration of said second semiconductor region and the same as that of said first semiconductor region, and being separated from said third surface portion of said substrate by said second semiconductor region therebetween;
an insulating film disposed on said substrate at least between said first and third region;
a gate electrode disposed on said insulating film between said first and third semiconductor regions so that one edge of said gate electrode is aligned with the termination of said first p-n junction at the surface of said substrate and the other edge of said gate electrode opposing to said one edge is aligned with the termination of an interface between said second and third regions at the surface of said substrate; and
electrodes connected to said first and third semiconductor region, respectively.

13. An insulated gate field effect transistor according to claim 12, wherein the impurity concentration of said second semiconductor region is less than twice that of said semiconductor substrate.

* * * * *